(12) United States Patent
Kawamura (10) Patent No.: US 10,583,985 B2
(45) Date of Patent: Mar. 10, 2020

(54) ARTICLE STORAGE FACILITY

(71) Applicant: Daifuku Co., Ltd., Osaka-shi (JP)

(72) Inventor: Shinsuke Kawamura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 72 days.

(21) Appl. No.: 16/056,735

(22) Filed: Aug. 7, 2018

(65) Prior Publication Data

US 2020/0048001 A1 Feb. 13, 2020

(51) Int. Cl.
*B65G 1/137* (2006.01)

(52) U.S. Cl.
CPC .................................. *B65G 1/1373* (2013.01)

(58) Field of Classification Search
CPC combination set(s) only.
See application file for complete search history.

(56) References Cited

U.S. PATENT DOCUMENTS

| | | | | |
|---|---|---|---|---|
| 2013/0313070 A1* | 11/2013 | Ogawa | ................... | B65G 35/06 198/370.01 |
| 2016/0288802 A1* | 10/2016 | Kinugawa | ................. | B61B 3/02 |
| 2016/0288808 A1* | 10/2016 | Izumi | ........................ | B61B 3/00 |
| 2017/0002523 A1* | 1/2017 | Ogisu | ....................... | B61B 3/02 |

FOREIGN PATENT DOCUMENTS

JP 20159953 A 1/2015

* cited by examiner

*Primary Examiner* — Kyle O Logan
(74) *Attorney, Agent, or Firm* — The Webb Law Firm (57) ABSTRACT

An article storage facility includes a first rail extending along a rail extending direction, a first storage rack configured to store a plurality of articles, a first transport device configured to move along the first rail and to transfer an article to and from the first storage rack, a second rail extending along the rail extending direction; and a second storage rack configured to store a plurality of articles, and a second transport device configured to move along the second rail and to transfer an article to and from the second storage rack. The first rail and the second rail are spaced apart by a set distance from each other along the rail extending direction. A third rail extends along the rail extending direction between the first rail and the second rail, and has a length less than the set distance. The third rail includes a fixed base and a movable rail portion. The movable rail portion is so configured that a location of the movable rail portion with respect to the fixed base when fixed to the fixed base can be changed.

8 Claims, 7 Drawing Sheets

ARTICLE STORAGE FACILITY

FIELD OF THE INVENTION

The present invention relates to an article storage facility comprising a first rail extending along a rail extending direction, a first storage rack extending along the first rail and configured to store a plurality of articles, a first transport device configured to move along the first rail and to transfer an article to and from the first storage rack, a second rail extending along the rail extending direction as in the case of the first rail, a second storage rack extending along the second rail and configured to store a plurality of articles, and a second transport device configured to move along the second rail and to transfer an article to and from the second storage rack.

BACKGROUND ART

An example of such an article storage facility is disclosed in JP Publication of Application No. 2015-9953 (Patent Document 1). In the following description of this background art section, the names of the parts and the reference numerals used in Patent Document 1 are shown in brackets.

The article storage facility (automated warehouse 100) of Patent Document 1 includes a rail (travel rail 51) extending along a rail extending direction, a first storage rack (stocker 1A) and a second storage rack (stocker 1B) extending along the rail (travel rail 51) for storing a plurality of articles, first transport devices (stacker cranes 7A and 7B) which move along the rail (travel rail 51) to transfer articles to and from the first storage rack (stocker 1A), and second transport devices (stacker cranes 7A and 7B) which move along the rail (travel rail 51) to transfer articles to and from the second storage rack (stocker 1A).

In the article storage facility (automated warehouse 100) of Patent Document 1, the rail (travel rail 51) extends from the area in which the first storage rack (stocker 1A) is located through the area in which the second storage rack (stocker 1B) is located. When performing maintenance of a transport device (stacker crane 7A or 7B), and when a transport device malfunctions, the transport device (stacker crane 7A or 7B) that needs to be worked on is moved to one of the areas (retreating areas E1 and E2) defined outside of the first storage rack (stocker 1A) and the second storage rack (stocker 1B).

Incidentally, in the article storage facility (automated warehouse 100) of Patent Document 1, one rail (travel rail 51) functions as the travel path for both the first transport devices (stacker cranes 7A and 7B) and the second transport devices (stacker cranes 7A and 7B). Thus, vibrations that occur when one of the transport devices (stacker crane 7A or 7B) moves on a rail (travel rail 51) are easily transmitted to other transport device(s) (stacker cranes 7A and 7B) through the rail (travel rail 51). Therefore, problems may occur, such as, transport devices (stacker cranes 7A and 7B) becoming unable to support articles properly due to vibrations transmitted through the rail (travel rail 51).

SUMMARY OF THE INVENTION

In light of this issue, an article storage facility is desired in which vibrations from one of the transport devices are less easily transmitted to another.

In light of above, an article storage facility comprises: a first rail extending along a rail extending direction; a first storage rack extending along the first rail and configured to store a plurality of articles; a first transport device configured to move along the first rail and to transfer an article to and from the first storage rack; a second rail extending along the rail extending direction; and a second storage rack extending along the second rail and configured to store a plurality of articles; a second transport device configured to move along the second rail and to transfer an article to and from the second storage rack; wherein the first rail and the second rail are located to be spaced apart, by a set distance, from each other along the rail extending direction, a third rail extending along the rail extending direction between the first rail and the second rail, and having a length less than the set distance, wherein the third rail includes a fixed base whose location is fixed with respect to the first rail and the second rail and a movable rail portion capable of being fixed to the fixed base, and wherein the movable rail portion is so configured that a location of the movable rail portion with respect to the fixed base when fixed to the fixed base can be changed.

With the arrangement described above, the third rail is located between the first rail and second rail which are located to be spaced apart, by the set distance, from each other along the rail extending direction. This third rail includes a fixed base whose location is fixed with respect to the first rail and the second rail and a movable rail portion whose location with respect to the fixed base when fixed thereto can be changed. Because the length of the third rail along the rail extending direction is less than the set distance, a gap is formed between the movable rail portion and the first rail or the second rail. Therefore, vibrations are less easily transmitted from one of the first rail and the second rail to the other of the first rail and the second rail, through the third rail. In other words, vibrations caused by one of the transport devices are less easily transmitted to the other of the transport devices.

In addition, with the arrangement described above, it becomes easy to move the first transport device properly onto the third rail by adjusting the location of the movable rail with respect to the fixed base to the first rail side. It becomes easy to move the second transport device properly onto the third rail by adjusting the location of the movable rail with respect to the fixed base to the second rail side. Thus, it becomes easy to move either of the first transport device and the second transport device properly onto the third rail by changing the location of the movable rail portion with respect to the fixed base, depending on which transport device needs to be worked on for maintenance and/or repair.

DETAILED DESCRIPTION OF EMBODIMENTS

Figure 1:
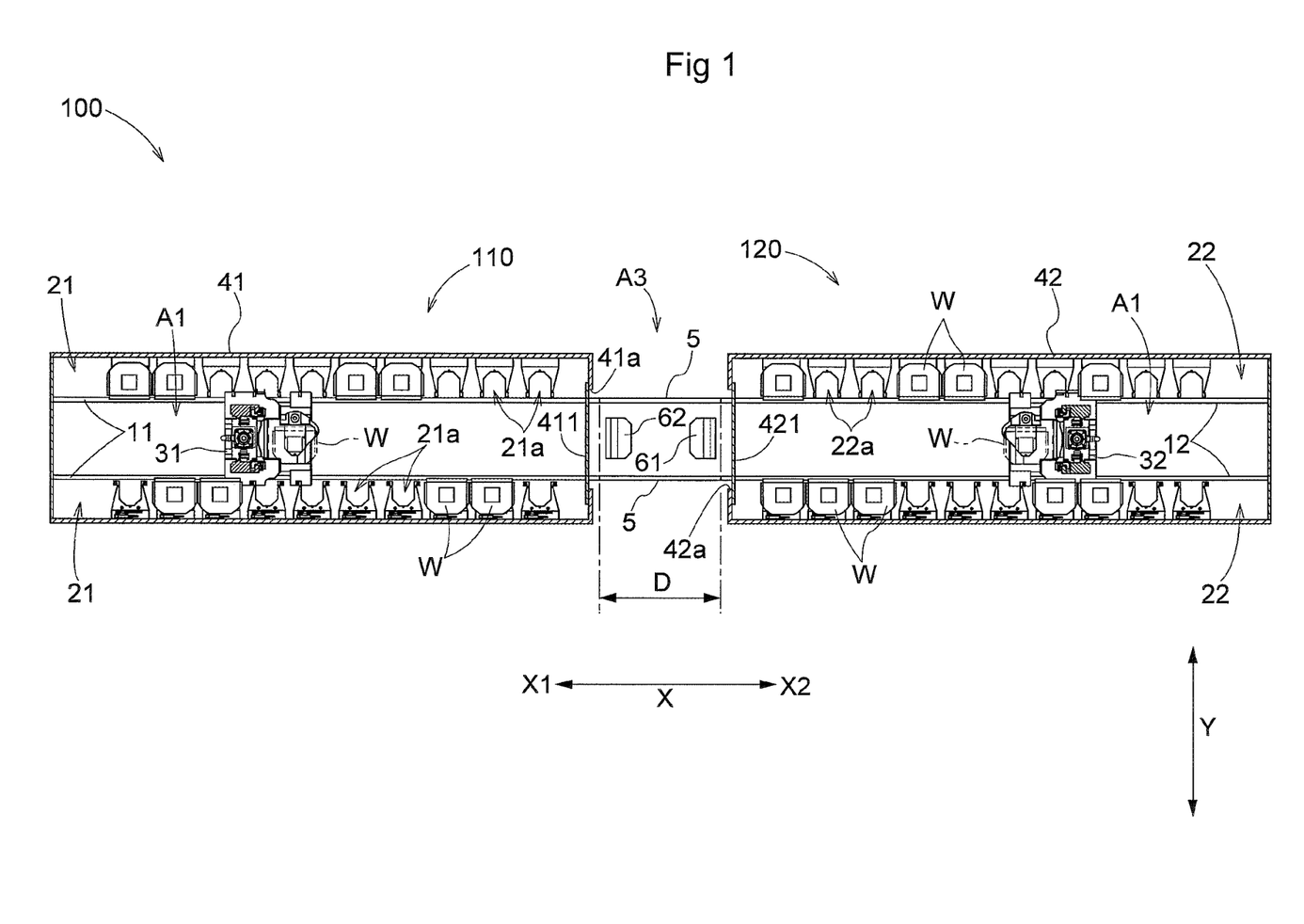
FIG. 1 is a plan view of an article storage facility in accordance with an embodiment.

A article storage facility 100 in accordance with an embodiment is described with reference to the attached drawings. As shown in FIG. 1, the article storage facility 100 includes a first stocker 110 and a second stocker 120.

Figure 2:
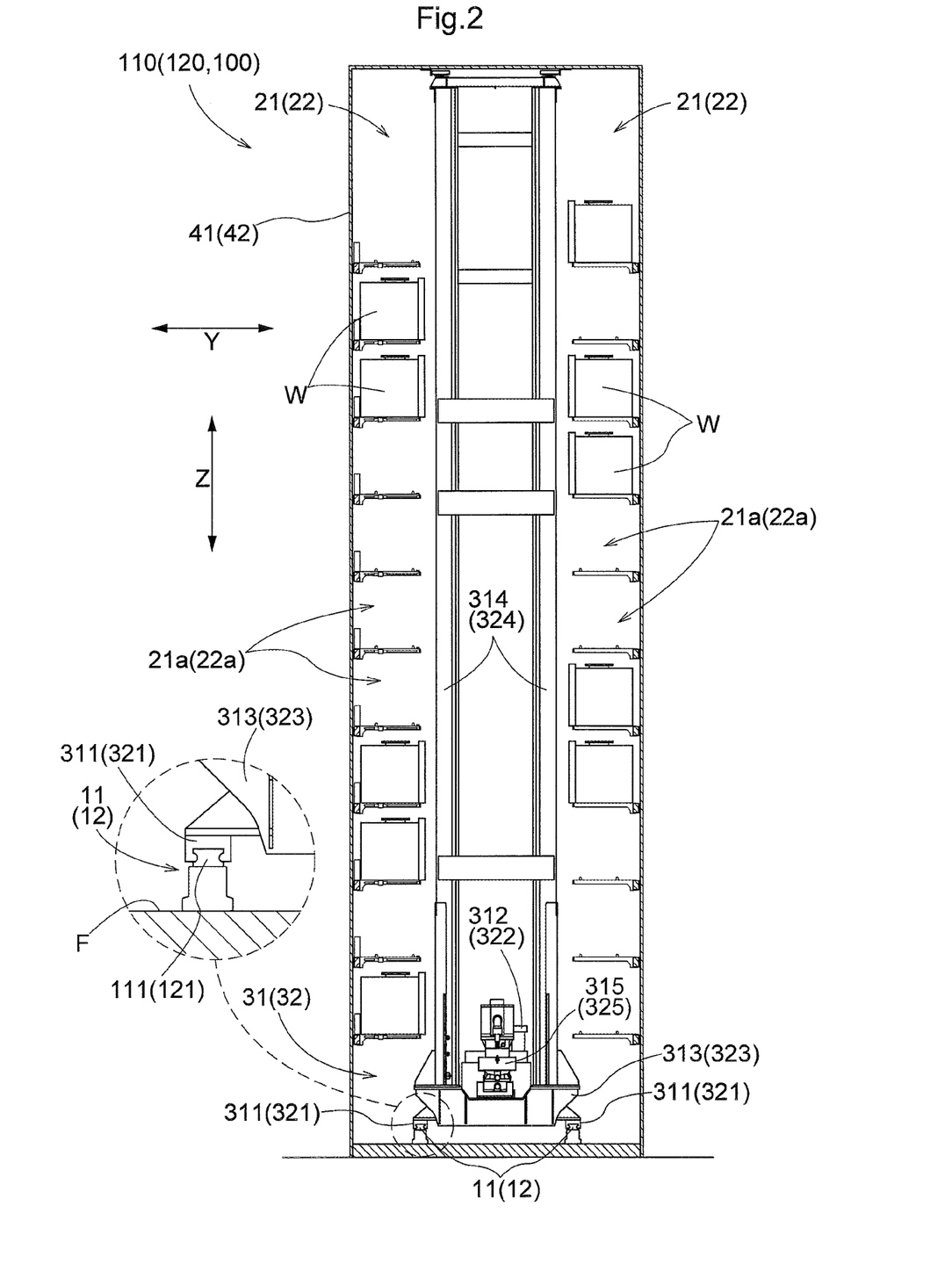
FIG. 2 is a front view of an article storage facility in accordance with an embodiment.

As shown in FIGS. 1 and 2, the first stocker 110 includes first rails 11 extending along a rail extending direction, first storage racks 21 each of which is disposed to extend along the first rails 11 and is configured to store a plurality of articles W, and a first transport device 31 configured to move along the first rails 11 and to transfer an article W to and from either of the first storage racks 21. Note that, in the present embodiment, each article W is a container (more specifically, a FOUP (Front Opening Unified Pod)) which is configured to hold one or more semiconductor substrates.

In the following description, the rail extending direction of the first rails 11 (the direction along which the first rails 11 extend) will be referred to as the "transport direction X". Since the first rails 11 are disposed parallel to the horizontal plane in the present embodiment, the transport direction X is also a direction parallel to the horizontal plane. In addition, the direction parallel to the horizontal plane and perpendicular to the transport direction X will be referred to as the "transfer direction Y". One direction (direction pointing to the left in FIG. 1) along the transport direction X will be referred to as the "first side direction X1 along the transport direction X" or simply "first side X1 along the transport direction X" when referring to the side corresponding to the first side direction X1 whereas the other or opposite direction (direction pointing to the right in FIG. 1) along the transport direction X will be referred to as the "second side direction X2 along the transport direction X" or simply "second side X2 along the transport direction X" when referring to the side corresponding to the second side direction X2. In addition, the vertical direction of the article storage facility 100 will be referred to as the "vertical direction Z". In addition, in the present embodiment, the expression "direction parallel to" a specified direction or a plane is not limited to the meaning that the direction in question is precisely parallel to the specified direction or plane but may mean that the direction in question is generally parallel to the specified direction or plane even with an amount of tilt (preferably less than 5 degrees and in no event greater than 10 degrees) with respect to the specified direction or plane.

The first rails 11 extend along the transport direction X. In the present embodiment, the first rails 11 extend straight. In addition, in the example shown in the drawings, the first rails 11 are a pair of rails 11 which are spaced apart from each other along the transfer direction Y.

Each first storage rack 21 has a plurality of first storage locations 21a each for storing an article W with first storage locations 21a arranged one adjacent to another along the transport direction X. As shown in FIG. 2, in the present embodiment, each first storage rack 21 has first storage locations 21a arranged in vertical rows each extending along the vertical direction Z with one vertical row adjacent to another along the transport direction X, in addition to being arranged in horizontal rows each extending along the transport direction X with one horizontal row adjacent to another along the vertical direction X. Each first storage rack 21 is so oriented that the first rails 11 are located on its front side (the side from which articles W are placed at, and retrieved from, the first storage locations 21a). In the present embodiment, one first storage rack 21 is located on each side, along the transfer direction Y, of the pair of first rails 11. In other words, a pair of first storage racks 21 are so located in the present embodiment that respective front sides face each other with the pair of first rails 11 located between the first storage racks 21.

As shown in FIG. 1, the first transport device 31 is configured to move along the first rails 11 and to transfer an article W to and from either of the first storage racks 21. As shown in FIG. 2, the first transport device 31 includes a first guided portion 311 configured to be guided by the first rails 11, and a first transfer device 312 configured to transfer an article W to and from any of the first storage locations 21a of either of the first storage racks 21.

The first guided portion 311 is configured to be capable of traveling on the first rails 11. In the present embodiment, the first guided portion 311 includes first guided members 311A and second guided members 311B with each first guided member 311A and the corresponding second guided member 311B being spaced apart from each other along the transport direction X (see FIG. 6). Each first guided member 311A is located on the first side X1, along the transport direction X, of the corresponding second guided member 311B. Each of the first guided members 311A and the second guided members 311B may be a block in a linear motion guide which travels on the corresponding one of the first rails 11. Since a pair of first rails 11 are installed in the present embodiment as described above, each of the pair of first rails 11a has one first guided member 311A and one second guided member 311B located thereon. In other words, in the present embodiment, the first guided portion 311 includes two first guided members 311A and two second guided members 311B.

The first transfer device 312 includes a support member configured to support an article W, and a transfer mechanism configured to move the support member along the transfer direction Y. This arrangement allows the first transfer device 312 to transfer an article W along the transfer direction Y to and from a first storage location 21a of either of the first storage racks 21. In the present embodiment, the first transfer device 312 is configured to transfer an article W to and from either of the first storage racks 21 located one on each side of the first rails 11 along the transfer direction Y.

As shown in FIG. 2, in the present embodiment, the first transport device 31 is a stacker crane, and has a first travel platform 313 to which the first guided portion 311 is attached, first masts 314 arranged vertically on the first travel platform 313, and a first vertically movable member 315 which is moved vertically along the first masts 314, and to which the first transfer device 312 is attached.

As shown in FIG. 1, the second stocker 120 is located to be on the second side X2 along the transport direction X of, and to be spaced apart from, the first stocker 110. The second stocker 120 includes second rails 12 extending along the transport direction, second storage racks 22 each of which is disposed to extend along the second rails 12 and is configured to store a plurality of articles W, and a second transport device 32 configured to move along the second rails 12 and to transfer an article W to and from either of the second storage racks 22.

The second rails 12 extend along the transport direction X. In the present embodiment, the second rails 12 are located at the same locations as the first rails 11 along the transfer direction Y and extend straight. In addition, in the example shown in the drawings, the second rails 12 are a pair of rails 12 which are spaced apart from each other along the transfer direction Y.

Each second storage rack 22 has a plurality of second storage locations 22a each for storing an article W with second storage locations 22a arranged one adjacent to another along the transport direction X. As shown in FIG. 2, in the present embodiment, each second storage rack 22 has second storage locations 22a arranged in vertical rows each extending along the vertical direction Z with one vertical row adjacent to another along the transport direction X, in addition to being arranged in horizontal rows each extending along the transport direction X with one horizontal row adjacent to another along the vertical direction X. Each second storage rack 22 is so oriented that the second rails 12 are located on its front side (the side from which articles W are placed at, and retrieved from, the second storage locations 22a). In the present embodiment, one second storage rack 22 is located on each side, along the transfer direction Y, of the pair of second rails 12. In other words, a pair of second storage racks 22 are so located in the present embodiment that respective front sides face each other with the pair of second rails 12 located between the second storage racks 22.

As shown in FIG. 1, the second transport device 32 is configured to move along the second rails 12 and to transfer an article W to and from either of the second storage racks 22. As shown in FIG. 2, the second transport device 32 includes a second guided portion 321 configured to be guided by the second rails 12, and a second transfer device 322 configured to transfer an article W to and from any of the second storage locations 22a of either of the second storage racks 22.

The second guided portion 321 is configured to be capable of traveling on the second rails 12. In the present embodiment, the second guided portion 321 includes third guided members 321A and fourth guided members 321B with each third guided member 321A and the corresponding fourth guided member 321B being spaced apart from each other along the transport direction X (see FIG. 8). Each third guided member 321A is located on the second side X2, along the transport direction X, of the corresponding fourth guided member 321B. Each of the third guided members 321A and the fourth guided members 321B may be a block in a linear motion guide which travels on the corresponding one of the second rails 12. Since a pair of second rails 12 are installed in the present embodiment as described above, each of the pair of second rails 12 has one third guided member 321A and one fourth guided member 321B located thereon. In other words, in the present embodiment, the second guided portion 321 includes two third guided members 321A and two fourth guided members 321B.

The second transfer device 322 includes a support member configured to support an article W, and a transfer mechanism configured to move the support member along the transfer direction Y. This arrangement allows the second transfer device 322 to transfer an article W along the transfer direction Y to and from any second storage location 21a of either of the second storage racks 22. In the present embodiment, the second transfer device 322 is configured to transfer an article W to and from either of the second storage racks 22 located one on each side of the second rails 12 along the transfer direction Y.

As shown in FIG. 2, in the present embodiment, the second transport device 32 is a stacker crane, and has a second travel platform 323 to which the second guided portion 321 is attached, second masts 324 arranged vertically on the second travel platform 323, and a second vertically movable member 325 which is moved vertically along the second masts 324, and to which the second transfer device 322 is attached.

As shown in FIG. 1, in the present embodiment, first walls 41 are provided to surround the side perimeter of a first transport area A1 in which the pair of first storage racks 21 are installed (perimeter as seen along a vertical direction Z). The first transport device 31 moves in the area (first transport area A1) within the first walls 41 and along the transport direction X to transport articles W one at a time. In addition, in the present embodiment, second walls 41 are provided to surround the side perimeter of a second transport area A2 in which the pair of second storage racks 22 are installed (perimeter as seen along a vertical direction Z). The second transport device 32 moves in the area (second transport area A2) within the second walls 42 and along the transport direction X to transport articles W one at a time.

A first opening 41a which the first transport device 31 can travel through is formed in the side surface of a first wall 41 that is on the second side X2 along the transport direction X. A second opening 42a which the second transport device 32 can travel through is formed in the side surface of a second wall 41 that is on the first side X1 along the transport direction X. In other words, the first opening 41a and the second opening 42a are formed in one of the first walls 41 and one of the second walls 42 respectively such that they face, or open, toward each other along the transport direction X. A first door 411 for opening and closing the first opening 41a is provided to that first wall 41 whereas a second door 421 for opening and closing the second opening 42a is provided to that second wall 42.

The first rails 11 extended to outside the first wall 41 through the first opening 41a. The second rails 12 extend to outside the second wall 42 through the second opening 42a. The first rails 11 are located to be spaced apart from the second rails 12 along the transport direction X by a set distance D. In other words, the distance between a second side X2 end, along the transport direction X, of each first rail 11 and the first side X1 end, along the transport direction X, of the corresponding second rail 12 is the set distance D.

The third rails 5 are provided between the first rails 11 and the second rails 12. The third rails 5 are configured to allow the first guided portion 311 of the first transport device 31 and the second guided portion 321 of the second transport device 32 to travel on and along them. An area that is outside the first walls 41 and the second walls 42 and in which the third rails 5 are located functions as a retreating area A3. At any one time, one of the first transport device 31 and the second transport device 32 can be in the retreating area A3. Maintenance work and/or repair can be performed on the first transport device 31 or the second transport device 32 when located in the retreating area A3. In the example shown in the drawings, the third rails 5 forming a pair are spaced apart from each other along the transfer direction Y, as with the first rails 11 and the second rails 12.

Figure 3:
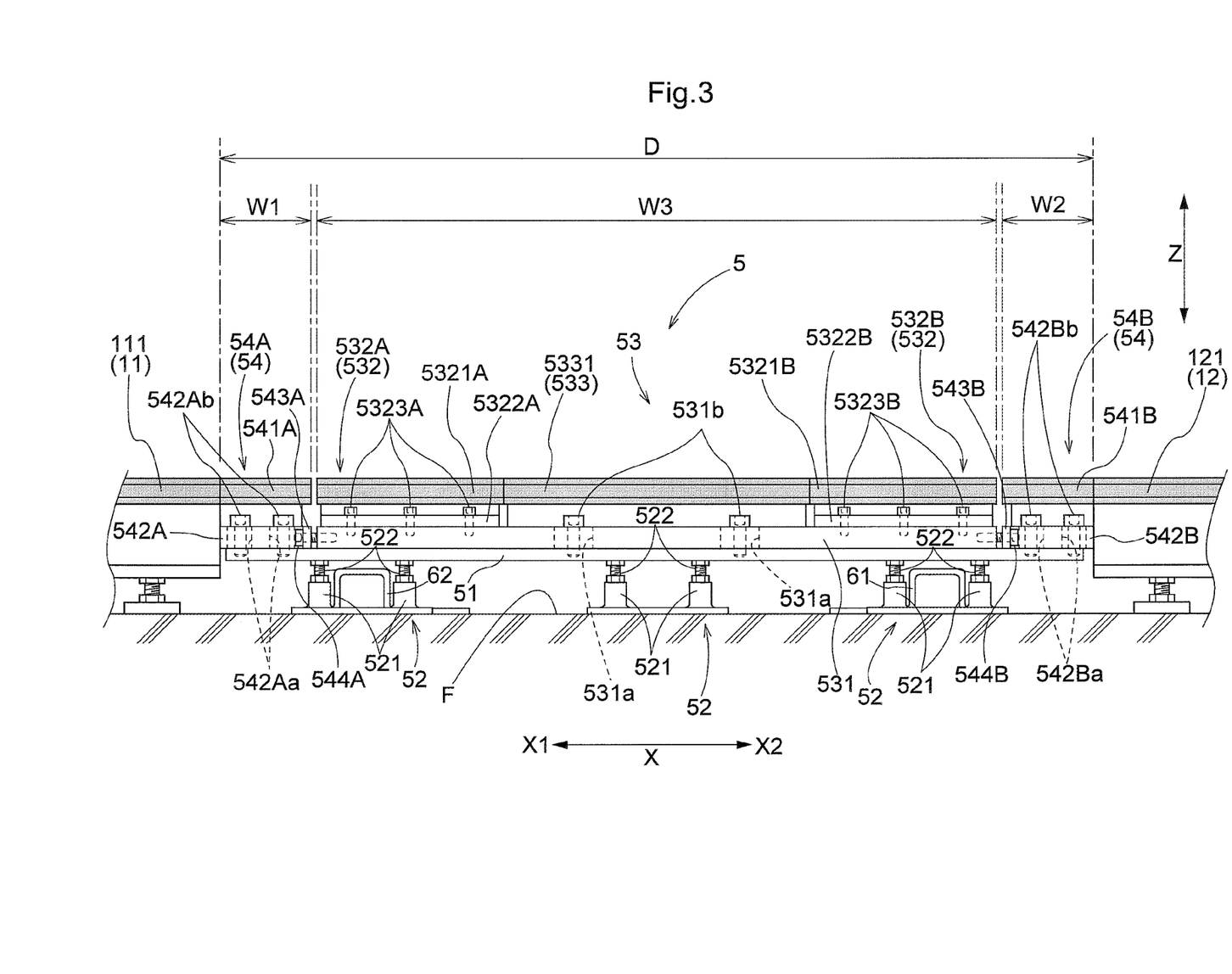
FIG. 3 is a side view showing the structure of a third rail.
Figure 4:
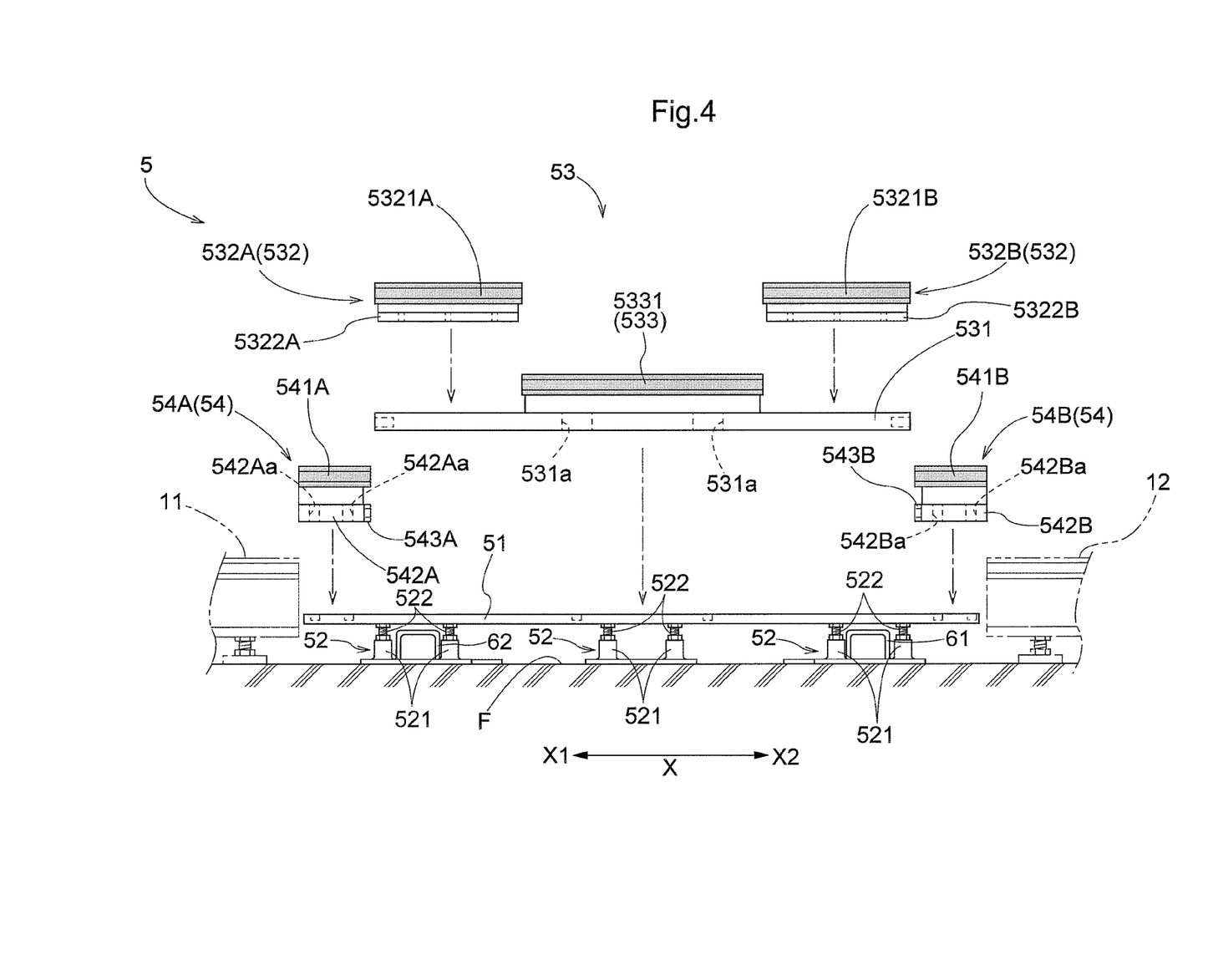
FIG. 4 is an exploded view of the third rail.

As shown in FIGS. 3 and 4, each first rail 11 has a first rail main body 111 for guiding the first guided portion 311 of the first transport device 31 and the second guided portion 321 of the second transport device 32. Each second rails 12 has a second rail main body 121 for guiding the first guided portion 311 of the first transport device 31 and the second guided portion 321 of the second transport device 32.

Each third rail 5 has a fixed base 51 whose position is fixed with respect to the corresponding first rail 11 and the second rail 12, and a movable rail portion 53 capable of being fixed to the corresponding fixed base 51.

Each fixed base 51 extends along the transport direction X and has a length less than a set distance D. In the present embodiment, the fixed base 51 is formed in a plate-shape (flat and thin (thickness less than width and length)) which has a flat top surface. Each fixed base 51 is supported by support members 52. In the present embodiment, each fixed base 51 is supported from below by a plurality of support members 52 that are installed on the floor surface F and are spaced apart from each other along the transport direction X.

The support members 52 are configured to be capable of changing the height (position along the vertical direction Z) of the corresponding fixed base 51. In the present embodiment, each support member 52 has a generally rod-shaped support column portion 521 extending along the vertical direction Z, and a rod portion 522 fixed to the fixed base 51. Each support column portion 521 has an internally threaded portion that is recessed downward from the upper end surface of the support column portion 521. The rod portion 522 has an externally portion that mates with the internally thread portion of the support column portion 521. Thus, the height of the fixed base 51 can be changed by rotating the support column portion 521 with respect to the rod portion 522 fixed to the fixed base 51. Note that the support members 52 are adjusted basically so that the top surfaces of the fixed bases 51 are parallel to the horizontal plane.

Each movable rail portion 53 is so configured that its location with respect to the corresponding fixed base 51 when fixed to the fixed base 51 can be changed. Each movable rail portion 53 has a movable base 531, and a separate rail portion 532 removably attached to the movable base 531.

Each movable base 531 extends along the transport direction X and has a length less than the set distance D. In the present embodiment, the length of each movable base 531 along the transport direction X is less than the length of the fixed base 5 along the transport direction X1. In the present embodiment, the movable base 531 is formed in a plate-shape (generally flat and thin (thickness less than length and width)) which has a top surface parallel to the top surface of the fixed base 51.

Figure 5:
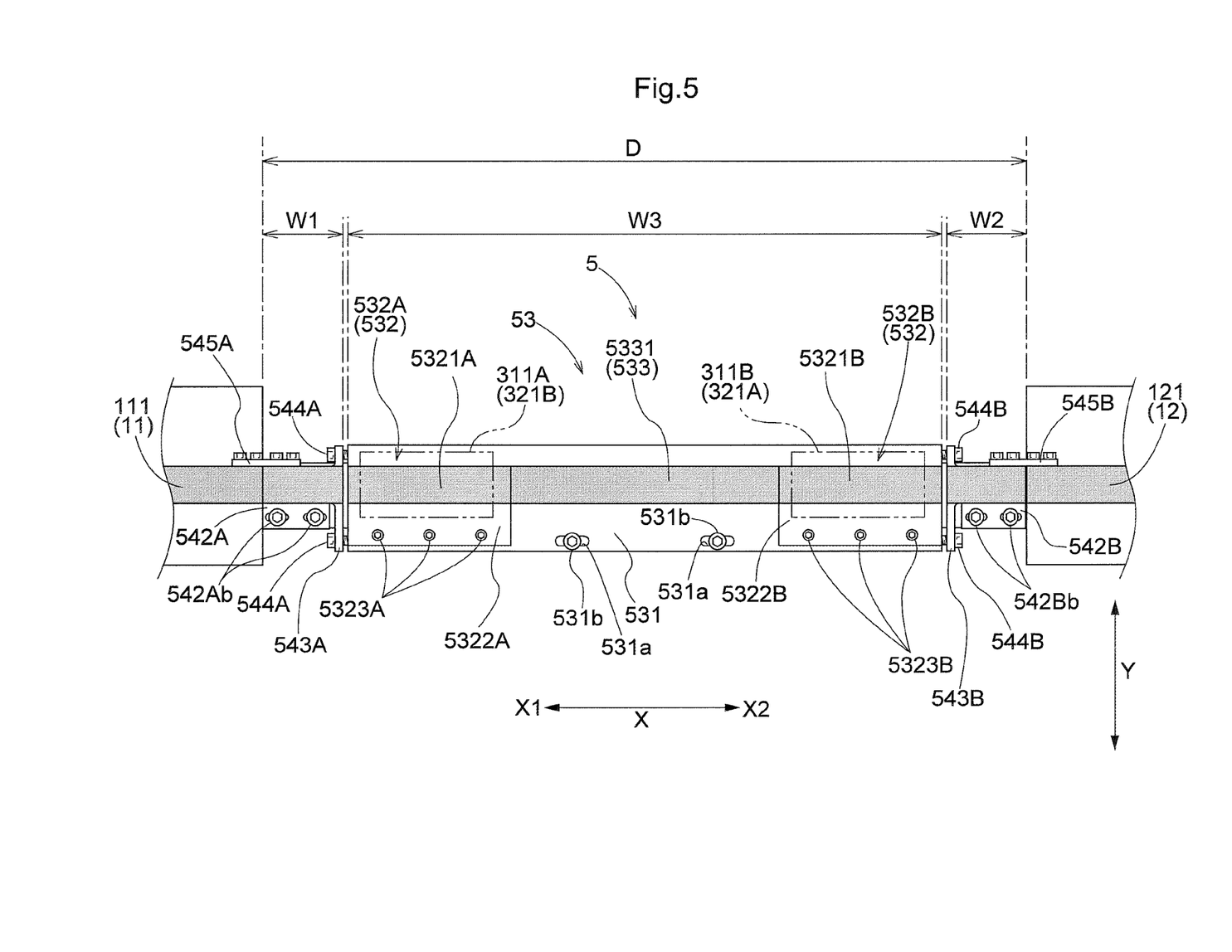
FIG. 5 is a plan view showing the structure of the third rail.

As shown in FIG. 5, in the present embodiment, movable base through holes 531a are formed in the movable base 531 so as to extend through the movable base 531 along the vertical direction Z. In the example shown, two movable base through holes 531a are so located to be spaced apart from each other along the transport direction X. The movable base fastening members 531b are inserted in respective movable base through holes 531a so that the movable base 531 is fixed to the fixed base 51 by these movable base fastening members 531b. In the example shown, each movable base fastening member 531b is a bolt, and has an externally threaded end portion that is in threading engagement with, and is thus fastened to, an internally threaded portion which is recessed downward from the top surface of the fixed base 51 with the body of the movable base fastening member 531b inserted in the corresponding movable base through hole 531a. The dimensions of each movable base through hole 531a along the transport direction X and the transfer direction Y are set to be greater than those of the body of the corresponding movable base fastening member 531b. Thus, the location of the movable base 531 along the transport direction X and the transfer direction Y, with respect to the fixed base 51 when fixed thereto can be changed. In addition, it is preferable to treat at least one of the bottom surface of the movable base 531 and the top surface of the fixed base 51 to reduce friction between the two surfaces to facilitate movement of the movable base 531 with respect to the fixed base 51. In the present example, these surfaces are treated to make them smooth to reduce surface roughness to less than or equal to a set value.

As shown in FIGS. 3 and 4, in the present embodiment, a separate rail portion 532 includes a first separate rail member 532A and a second separate rail member 532B. A first separate rail member 532A and the corresponding second separate rail member 532B are spaced apart from each other along the transport direction X. A fixed rail member 533 is provided between a first separate rail member 532A and the corresponding second separate rail member 532B. In other words, in the present embodiment, each movable rail portion 53 has a movable base 531, a first separate rail member 532A, a second separate rail member 532B, and a fixed rail member 533.

Each first separate rail member 532A has a first separate rail main body portion 5321A for guiding the first guided portion 311 of the first transport device 31 and the second guided portion 321 of the second transport device 32, and a first separate rail fixed portion 5322A fixed to the movable base 531.

The first separate rail main body portion 5321A extends along the transport direction X. As shown in FIG. 5, the first separate rail fixed portion 5322A projects to one side (downward in FIG. 5) along the transfer direction Y with respect to the corresponding first separate rail main body portion 5321A. Each first separate rail fixed portion 5322A is fixed to the movable base 531 by first separate rail fastening members 5323A. In addition, each first separate rail fixed portion 5322A is unfastened from the corresponding movable base 531 by removing the first separate rail fastening members 5323A. Thus, each first separate rail member 532A is removably attached to corresponding movable base 531. In the example shown, each first separate rail fastening member 5323A is a bolt, and is fastened to an internally threaded portion which is formed to be recessed downward from the top surface of a movable base 531 with the first separate rail fastening member 5323A inserted in a through hole formed in, and extending along the vertical direction Z through, a first separate rail fixed portion 5322A. In addition, in the example shown, each first separate rail fixed portion 5322A uses three first separate rail fastening members 5323A at locations that are spaced apart from each other along the transport direction X.

As shown in FIG. 5, in the present embodiment, each first separate rail member 532A is so located to correspond in position along the transport direction X to the location of a first guided member 311A of the first transport device 31 when the first transport device 31 is located on the third rails 5, or the location of a fourth guided member 321B of the second transport device 32 when the second transport device 32 is located on the third rails 5. Note that the length, along the transport direction X, of the first guided member 311A and of the fourth guided member 321B is less than the length, along the transport direction X, of the first separate rail main body portion 5321A of a first separate rail member 532A.

In addition, in the present embodiment, the first separate rail fastening members 5323A are so located that they do not overlap with the first guided member 311A of the first transport device 31 or the fourth guided member 321B of the second transport device 32 as seen along the vertical direction Z when the first transport device 31 or the second transport device 32 is located on the third rails 5. This allows the first separate rail fastening members 5323A to be easily installed and removed even if the first transport device 31 or the second transport device 32 is located on the third rails 5.

Here, when it is stated (as a way to describe locations of two things (which also include intangible entities, such as, holes)) that two things do not "overlap" as seen along a specified direction, it means that, even if an imaginary line parallel to the specified direction is moved in all directions perpendicular to the imaginary line, there is no location or area in which this imaginary line intersects both of the two things at the same time.

As shown in FIGS. 3 and 4, each second separate rail member 532B has a second separate rail main body portion 5321B for guiding the first guided portion 311 of the first transport device 31 and the second guided portion 321 of the second transport device 32, and a second separate rail fixed portion 5322B fixed to the movable base 531.

The second separate rail main body portion 5321B extends along the transport direction X. As shown in FIG. 5, the second separate rail fixed portion 5322B projects to one side (downward in FIG. 5) along the transfer direction Y with respect to the corresponding second separate rail main body portion 5321B. Each second separate rail fixed portion 5322B is fixed to the corresponding movable base 531 by second separate rail fastening members 5323B inserted in the through holes which extend through the second separate rail fixed portion 5322B along the vertical direction Z, In addition, each second separate rail fixed portion 5322B is unfastened from the corresponding movable base 531 by removing the second separate rail fastening members 5323B. Thus, each second separate rail member 532B is removably attached to corresponding movable base 531. Note that, in the example shown, each second separate rail fixed portion 5322B uses three second separate rail fastening members 5323B at locations that are spaced apart from each other along the transport direction X.

As shown in FIG. 5, in the present embodiment, each second separate rail member 532B is so located to correspond in position along the transport direction X to the location of a second guided member 311B of the first transport device 31 when the first transport device 31 is located on the third rails 5, or the location of a third guided member 321A of the second transport device 32 when the second transport device 32 is located on the third rails 5. Note that the length, along the transport direction X, of the second guided member 311B and of the third guided member 321A is less than the length, along the transport direction X, of the second separate rail main body portion 5321B of a second separate rail member 532B.

In addition, in the present embodiment, the second separate rail fastening members 5323B are so located that they do not overlap with the second guided member 311B of the first transport device 31 or the third guided member 321A of the second transport device 32 as seen along the vertical direction Z when the first transport device 31 or the second transport device 32 is located on the third rails 5. This allows the second separate rail fastening members 5323B to be easily installed and removed even if the first transport device 31 or the second transport device 32 is located on the third rails 5.

Each fixed rail member 533 is fixed to corresponding movable base 531 between the corresponding first separate rail member 532A and the second separate rail member 532B with the first separate rail member 532A and the second separate rail member 532B fixed to the movable base 531. Each fixed rail member 533 has a fixed rail main body 5331 for guiding the first guided portion 311 of the first transport device 31 and the second guided portion 321 of the second transport device 32.

The fixed rail main body portion 5331 extends along the transport direction X. With the corresponding first separate rail member 532A and the second separate rail member 532B fixed to the movable base 531, each fixed rail main body 5331 is so located to connect the first separate rail main body portion 5321A of the first separate rail member 532A and the second separate rail main body portion 5321B of the second separate rail member 532B to each other. In other words, the fixed rail main body 5331, the first separate rail main body portion 5321A, and the second separate rail main body portion 5321B are so located that the first guided portion 311 of the first transport device 31 and the second guided portion 321 of the second transport device 32 can travel thereon, with the corresponding first separate rail member 532A and the second separate rail member 532B fixed to the movable base 531. In the example shown in FIGS. 3 and 5, the first side X1 end, along the transport direction X, of the fixed rail main body 5331 is in contact with the second side X2 end, along the transport direction X, of the first separate rail main body portion 5321A with these ends located at the same position along the transfer direction Y and along the vertical direction Z. In addition, the second side X2 end, along the transport direction X, of the fixed rail main body 5331 is in contact with the first side X1 end, along the transport direction X, of the second separate rail main body portion 5321B with these ends located at the same position along the transfer direction Y and along the vertical direction Z.

As shown in FIGS. 3 and 4, in the present embodiment, each third rail 5 includes a connecting rail portion 54 configured to connect the corresponding movable rail portion 53 to corresponding first rail 11 or second rail 12. The connecting rail portion 54 includes a first connecting rail member 54A fixed to the fixed base 51 at a location on the first rail 11 side with respect to the movable rail portion 53, and a second connecting rail member 54B fixed to the fixed base 51 at a location on the second rail 12 side with respect to the movable rail portion 53. In the example shown, the first connecting rail member 54A is fixed to a first side X1 end portion, along the transport direction X, of the fixed base 51 whereas the second connecting rail member 54B is fixed to a second side X2 end portion, along the transport direction X, of the fixed base 51.

Each first connecting rail member 54A has a first connecting rail main portion 541A for guiding the first guided portion 311 of the first transport device 31 and the second guided portion 321 of the second transport device 32, a first connecting rail fixed portion 542A fixed to the fixed base 51, and a first flange portion 543A.

The first connecting rail main portion 541A extends along the transport direction X. As shown in FIG. 5, the first connecting rail fixed portion 542A projects to one side (downward in FIG. 5) along the transfer direction Y with respect to the corresponding first connecting rail main body portion 541A. First connecting rail through holes 542Aa are formed in the first connecting rail fixed portion 542A to extend therethrough along the vertical direction Z. In the example shown, each first connecting rail fixed portion 542A has two first connecting rail through holes 542Aa at locations that are spaced apart from each other along the transport direction X. A first connecting rail fastening member 542Ab is inserted in each first connecting rail through hole 542Aa so that the first connecting rail main portion 541A is fixed to the fixed base 51 by these first connecting rail fastening members 542Ab. In the example shown, each first connecting rail fastening member 542Ab is a bolt, and the dimensions of each first connecting rail through hole 542Aa along the transport direction X and the transfer direction Y are set to be greater than those of the externally threaded portion of the corresponding first connecting rail fastening member 542Ab. Each bolt, as a first connecting rail fastening member 542Ab, has either a large enough head or alternatively, a large enough washer is placed between the head and the top surface of the fixed base 51, so that the head of the bolt will not fall into the first connecting rail through hole 542Aa (which is true with any other bolts described as an example of fastening members and fasteners described below). Thus, the location of each first connecting rail member 54A along the transport direction X and the transfer direction Y with respect to the fixed base 51 when fixed thereto can be changed.

As shown in FIG. 5, the first flange portion 543A is connected to the second side X2 end, along the transport direction X, of the first connecting rail member 54A such that the first flange portion 543A projects to both sides along the transfer direction Y with respect to the first connecting rail main portion 541A. As shown in FIGS. 3 and 5, the first flange portion 543A is connected to the movable base 531 by first fasteners 544A. In the example shown, each first fastener 544A is a bolt, and is fastened to an internally threaded portion recessed in the second side direction X2 along the transport direction X from the first side X1 end surface, along the transport direction X, of the movable base 531 with the first fastener 544A inserted in a through hole that extends through the first flange portion 543A along the transport direction X. As described above, the movable base 531 can be moved with respect to the fixed base 51; thus, the location of the movable base 531 along the transport direction X can be changed depending on the fastening relation of the first fasteners 544A to the movable base 531 (i.e., depending on the depth by which the first fasteners 544A are inserted into the movable base 531 while in threaded engagement with the corresponding internally threaded portions of the movable base 531, in case bolts are used as the first fasteners 544A as in the present example). Thus, in the present example, first fasteners 544A function as a "first adjustment mechanism" attached to a first connecting rail member 54A and configured to change the location of a movable rail portion 53 with respect to a first connecting rail member 54A.

As shown in FIG. 5, the first connecting rail member 54A is connected to a first rail 11 by a first connecting member 545A. In the example shown, the first connecting member 545A has a plate extending along the transport direction X, first bolts that fix the plate to the first connecting rail member 54A, and second bolts that fix the plate to the first rail 11.

Each first connecting rail member 54A is so located to allow the first guided portion 311 of the first transport device 31 and the second guided portion 321 of the second transport device 32 to travel on the first connecting rail main portions 541A of the first connecting rail members 54A and the first rail main bodies 111 of the first rails 11. In the example shown in FIGS. 3 and 5, the first side X1 end, along the transport direction X, of each first connecting rail main portion 541A is in contact with the second side X2 end, along the transport direction X, of corresponding first rail main body 111 with these ends located at the same position along the transfer direction Y and along the vertical direction Z. Note that the location of the first connecting rail main portion 541A along the vertical direction Z can be changed, for example, by placing a spacer underneath the first connecting rail main portion 541A.

As shown in FIGS. 3 and 4, each second connecting rail member 54B has a second connecting rail main portion 541B for guiding the first guided portion 311 of the first transport device 31 and second guided portion 321 of the second transport device 32, a second connecting rail fixed portion 542B fixed to the fixed base 51, and a second flange portion 543B.

Each second connecting rail main portion 541B extends along the transport direction X. As shown in FIG. 5, the second connecting rail fixed portion 542B projects to one side (downward in FIG. 5) along the transfer direction Y with respect to the corresponding second connecting rail main body portion 541B. Second connecting rail through holes 542Ba are formed in the second connecting rail fixed portion 542B to extend therethrough along the vertical direction Z. In the example shown, each second connecting rail fixed portion 542B has two second connecting rail through holes 542Ba at locations that are spaced apart from each other along the transport direction X. A second connecting rail fastening member 542Bb is inserted in each second connecting rail through hole 542Ba so that the second connecting rail main portion 541B is fixed to the fixed base 51 by these second connecting rail fastening members 542Bb. In the example shown, each second connecting rail fastening member 542Bb is a bolt, and the dimensions of each second connecting rail through hole 542Ba along the transport direction X and the transfer direction Y are set to be greater than those of the externally threaded portion of the corresponding second connecting rail fastening member 542Bb. Thus, the location of each second connecting rail member 54B along the transport direction X and the transfer direction Y with respect to the fixed base 51 when fixed thereto can be changed.

As shown in FIG. 5, the second flange portion 543B is connected to the first side X1 end, along the transport direction X, of the second connecting rail member 54B such that the second flange portion 543B projects to both sides along the transfer direction Y with respect to the second connecting rail main portion 541B. As shown in FIGS. 3 and 5, the second flange portion 543B is connected to the movable base 531 by second fasteners 544B. In the example shown, each second fastener 544B is a bolt, and is fastened to an internally threaded portion recessed in the first side direction X1 along the transport direction X from the second side X2 end surface, along the transport direction X, of the movable base 531 with the second fastener 544B inserted in a through hole that extends through the second flange portion 543B along the transport direction X. As described above, the movable base 531 can be moved with respect to the fixed base 51; thus, the position of the movable base 531 along the transport direction X can be changed depending on the fastening relation of the second fasteners 544B to the movable base 531 (i.e., depending on the depth by which the second fasteners 544B are inserted into the movable base 531 while in threaded engagement with the corresponding internally threaded portions of the movable base 531, in case bolts are used as the second fasteners 544B as in the present example). Thus, in the present example, second fasteners 544B function as a "second adjustment mechanism" attached to a second connecting rail member 54B and configured to change the location of a movable rail portion 53 with respect to a second connecting rail member 54B.

As shown in FIG. 5, the second connecting rail member 54B is connected to a second rail 12 by a second connecting member 545B. In the example shown, the second connecting member 545B has a plate extending along the transport direction X, first bolts that fix the plate to the second connecting rail member 54B, and second bolts that fix the plate to the second rail 12.

The second connecting rail members 54A are so located to allow the first guided portion 311 of the first transport device 31 and the second guided portion 321 of the second transport device 32 to travel on the second connecting rail main portions 541B of the second connecting rail members 54B and the second rail main bodies 121 of the second rails 12. In the example shown in FIGS. 3 and 5, the second side X2 end, along the transport direction X, of each second connecting rail main portion 541B is in contact with the first side X1 end, along the transport direction X, of corresponding second rail main body 121 with these ends located at the same position along the transfer direction Y and along the vertical direction Z. Note that the location of the second connecting rail main portion 541B along the vertical direction Z can be changed, for example, by placing a spacer underneath the second connecting rail main portion 541B.

In the description below, the length of the first connecting rail main portion 541A along the transport direction X will be referred to as the "first connecting rail width W1" whereas the length of the second connecting rail main portion 541B will be referred to as the "second connecting rail width W2". Further, the length of the rail main body of the movable rail portion 53 along the transport direction X (i.e., the sum of the length of the first separate rail main body portion 5321A along the transport direction X, the length of the second separate rail main body portion 5321B along the transport direction X, and the length of the fixed rail main body 5331 along the transport direction X) will be referred to as the "movable rail width W3".

The sum of the first connecting rail width W1, the second connecting rail width W2, and the movable rail width W3 is less than the set distance D which is the distance between a first rail 11 and corresponding second rail 12 along the transport direction X. Thus, the location of each movable rail portion 53 along the transport direction X with respect to the fixed base 51 when fixed thereto can be changed between a location in which the first side X1 end (along the transport direction X) of the first separate rail main body portion 5321A is in contact with the second side X2 end (along the transport direction X) of the first connecting rail main portion 541A and a location in which the second side X2 end (along the transport direction X) of the second separate rail main body portion 5321B is in contact with the first side X1 end (along the transport direction X) of the second connecting rail main portion 541B.

Figure 6:
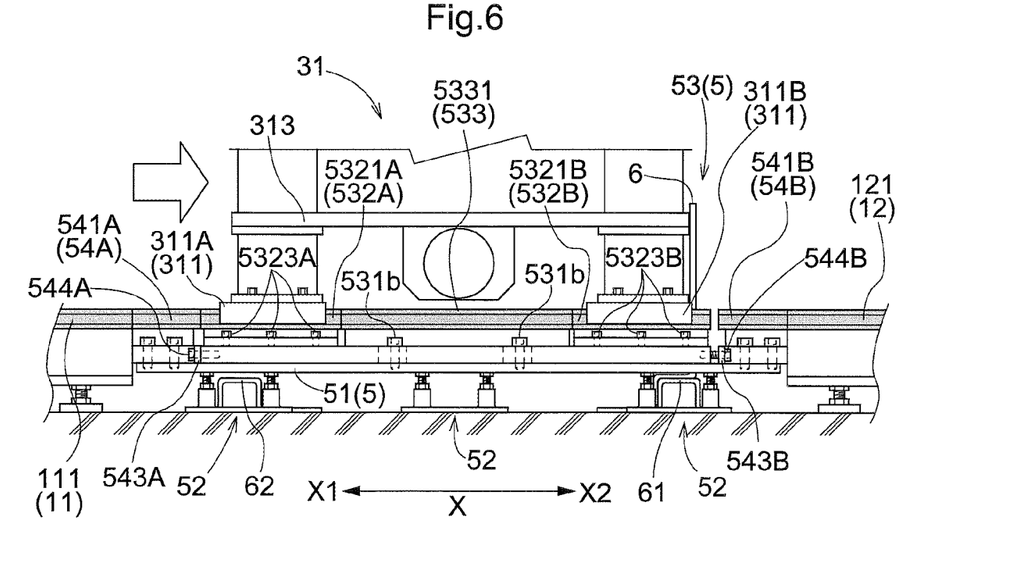
FIG. 6 shows how a first transport device is moved onto third rails.
Figure 7:
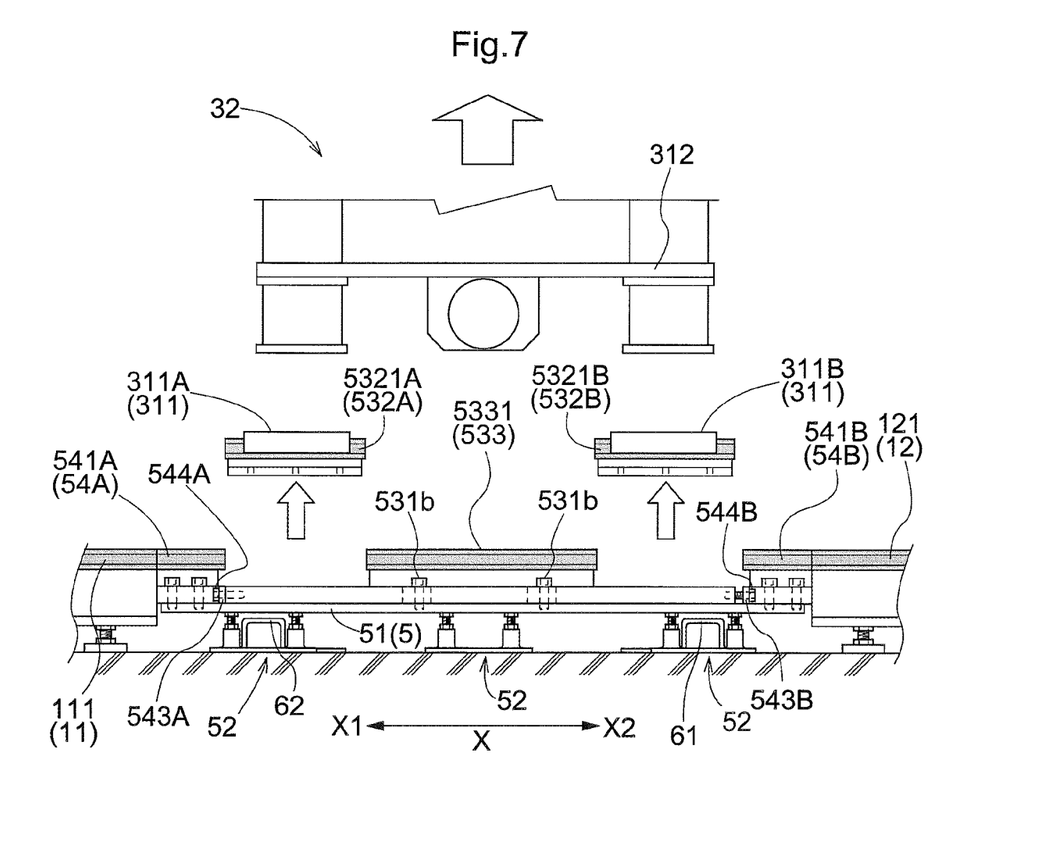
FIG. 7 shows how a separate rail portion is removed together with the first guided portion of the first transport device.
Figure 8:
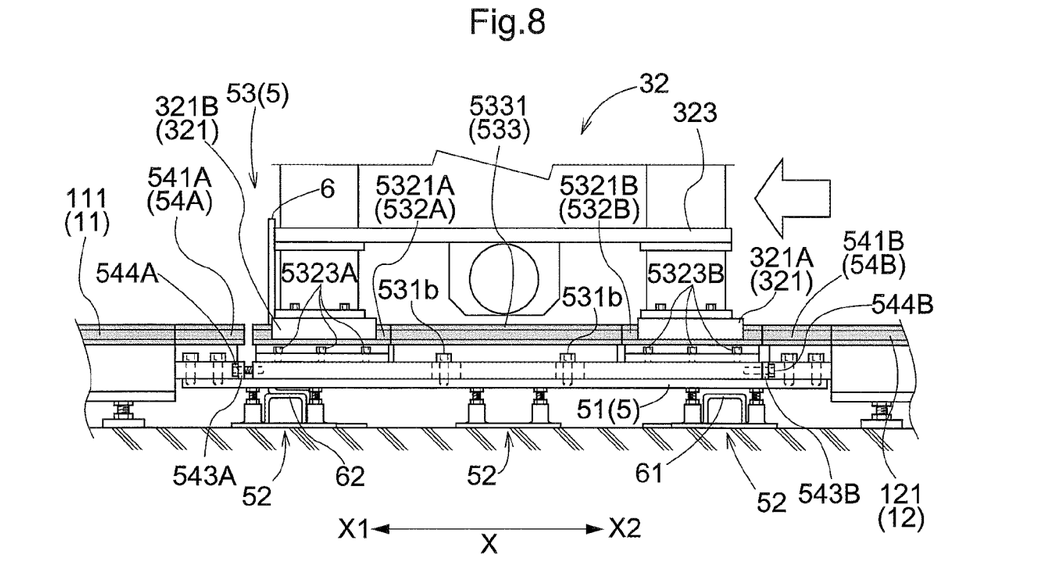
FIG. 8 shows how a second transport device is moved onto the third rails.

Reference is now made to FIGS. 6 through 8 to describe how the relevant parts and portions are rearranged when performing maintenance and/or repair on the first guided portion 311 of the first transport device 31 or the second guided portion 321 of the second transport device 32.

As shown in FIG. 6, when moving the first transport device 31 onto the third rails 5, the location of each movable rail portion 53 with respect to the corresponding fixed base 51 is changed so that the first transport device 31 can be moved from the first connecting rail members 54A to the first separate rail members 532A and vice versa. More specifically, after releasing the fastening of the movable base 531 to the fixed base 51 by the movable base fastening members 531b (i.e., after loosening the movable base fastening members 531b to such a sufficient degree that the movable base 531 can be moved with respect to the fixed base 51 in case the movable base fastening members 531b are bolts as in the present example), the fastening relations of the first fasteners 544A and the second fasteners 544B to the movable base 531 are changed (i.e., in case the second fasteners 544B and the first fasteners 544A are bolts, depths by which the first fasteners 544A and the second fasteners 544B are inserted into the movable base 531 while in threaded engagement with corresponding internally threaded portions of the movable base 531 are changed by turning them). In the example shown, the location of the movable rail portion 53 with respect to the fixed base 51 when fixed thereto is changed so that the first side X1 end, along the transport direction X, of the first separate rail main body portion 5321A is in contact with the second side X2 end, along the transport direction X, of the first connecting rail main portion 541A. When this procedure is performed, the locations of the first connecting rail member 54A and the first separate rail member 532A, along the transfer direction Y, are also adjusted so that they coincide with each other.

A stop member 6 is attached to a first attaching member 61 fixed to the floor surface F. The stop member 6 is removably attached to the first attaching member 61 by means of fastening members, such as bolts. In the present embodiment, the first attaching member 61 is located in a second side X2 end portion, along the transport direction X, of the retreating area A3 (see FIG. 1) and between the pair of third rails 5. Subsequently, the first transport device 31 is moved onto the third rails 5. The first transport device 31 is stopped at the proper position on the third rails 5 as a result of the first transport device 31 coming into contact with the stop member 6. The position and shape of the first attaching member 61 as well as the shape of the stop member 6 are designed such that the first guided members 311A are located on the corresponding the first separate rail members 532A while the second guided members 311B are located on the corresponding second separate rail members 532B when the first transport device 31 is stopped at the proper position on the third rails 5.

Next, as shown in FIG. 7, after removing fastening members, such as bolts, for fastening the first guided members 311A and the second guided members 311B to the first travel platform 313, the first travel platform 313 is lifted with a jack or any other conventional tool to separate the first travel platform 313 from the first guided members 311A and the second guided members 311B.

Subsequently, the first separate rail fastening members 5323A which fasten each first separate rail member 532A to the corresponding movable base 531, and the second separate rail fastening members 5323B which fastens each second separate rail member 532B to the corresponding movable base 531 are removed. Any member or members (among the first separate rail members 532A with the first guided members 311A supported thereon and the second separate rail members 532B with the second guided members 311B supported thereon) that require maintenance and/or repair (both the first separate rail members 532A and the second separate rail members 532B, in the example shown in the drawing) are removed from corresponding the movable bases 531. Subsequently, any guided member or members that require maintenance and/or repair are removed from corresponding separate rail members to perform maintenance, repair, and/or replacement, etc.

On the other hand, when moving the second transport device 32 onto the third rails 5 as shown in FIG. 6, the location of each movable rail portion 53 with respect to the corresponding fixed base 51 when fixed thereto is changed so that the second transport device 32 can be moved from the second connecting rail members 54B to the second separate rail members 532B and vice versa. More specifically, after releasing the fastening of the movable base 531 to the fixed base 51 by the movable base fastening members 531b (i.e., after loosening the movable base fastening members 531b to such a sufficient degree that the movable base 531 can be moved with respect to the fixed base 51 in case the movable base fastening members 531b are bolts as in the present example), the fastening relations of the first fasteners 544A and the second fasteners 544B to the movable base 531 are changed (i.e., in case the second fasteners 544B and the first fasteners 544A are bolts, depths by which the first fasteners 544A and the second fasteners 544B are inserted into the movable base 531 while in threaded engagement with corresponding internally threaded portions of the movable base 531 are changed by turning them). In the example shown, the location of movable rail portion 53 with respect to the fixed base 51 when fixed thereto is changed so that the second side X2 end, along the transport direction X, of the second separate rail main body portion 5321B is in contact with the first side X1 end, along the transport direction X, of the second connecting rail main portion 541B. When this procedure is performed, the position of the second connecting rail member 54B and the second separate rail member 532B, along the transfer direction Y, are also adjusted so that they coincide with each other.

The stop member 6 is removed from the first attaching member 61. The stop member 6 is attached to a second attaching member 62 fixed to the floor surface F as is the case of the first attaching member 61. The stop member 6 is removably attached to the second attaching member 62 by means of fastening members, such as bolts. In the present embodiment, the second attaching member 62 is located in a first side X1 end portion, along the transport direction X, of the retreating area A3 (see FIG. 1) and between the pair of third rails 5. Subsequently, the second transport device 32 is moved onto the third rails 5. The second transport device 32 is stopped at the proper position on the third rails 5 as a result of the second transport device 32 coming into contact with the stop member 6. The position and shape of the second attaching member 62 as well as the shape of the stop member 6 are designed such that the fourth guided members 321B are located on the corresponding the first separate rail members 532A while the third guided members 321A are located on the corresponding second separate rail members 532B when the second transport device 32 is stopped at the proper position on the third rails 5. In addition, in the present embodiment, the portion of the stop member 6 that comes into contact with the first transport device 31 or the second transport device 32 is provided with one or more members made of elastic and cushioning material, such as urethane.

The remaining procedure is identical to that for the first guided portion 311 of the first transport device 31; thus, description thereof is omitted.

Other Embodiments (1) In the embodiment described above, an example is described in which the first guided portion 311 of the first transport device 31 includes four guided members 311A and 311B while the second guided portion 321 of the second transport device 32 includes four guided members 321A and 321B. However, the invention is not limited to such an arrangement. The guided portion of each transport device may include one guided member or more than four guided members. In addition, in the embodiment described above, an example is described in which the separate rail portion 532 of each movable rail portion 53 includes two separate rail members 532A and 532B. The number of separate rail members may be changed depending on the number of guided members and their locations.

(2) In the embodiment described above, an example is described in which each fixed rail member 533 is located between two corresponding separate rail members 532A and 532B. However, the invention is not limited to such an arrangement. Each movable rail portion 53 may be so configured that it does not include such a fixed rail member 533. In such a case, the movable rail portion 53 would have a movable base 531, and one or more separate rail members as the separate rail portion 532 removably attachable to the movable base 531. The entire rail surface of the movable rail portion 53 is formed by the one or more separate rail members. Alternatively, each movable rail portion 53 is so configured that it does not include any separate rail portion 532. In such a case, the movable rail portion 53 would have a movable base 531, and a fixed rail member fixed to the movable base 531. The entire rail surface of the movable rail portion 53 is formed by the fixed rail member.

(3) In the embodiment described above, an example is described in which each third rail 5 has the connecting rail portion 54. However, the invention is not limited to such an arrangement. The third rail 5 may be so configured that it does not have the connecting rail portion 54. In such a case, the movable rail portion 53 would be so configured that its location with respect to the fixed base 51 when fixed thereto can be changed between a location at which the first side X1 end, along the transport direction X, of the first separate rail main body portion 5321A is in contact with the second side X2 end, along the transport direction X, of the first rail main body 111, and a location at which the second side X2 end, along the transport direction X, of the second separate rail main body portion 5321B is in contact with the first side X1 end, along the transport direction X, of the second rail main body 121.

(4) In addition, an arrangement disclosed in any of the embodiments described above can also be used in combination with any arrangement disclosed in any other embodiment unless inconsistency arises. Regarding any other arrangements and features, the embodiments disclosed in the present description are provided for the purposes of illustration only regarding all aspects. Therefore, it is possible to make various suitable changes without departing from the spirit of the present disclosure.

Summary of Embodiments Described Above

A brief summary of the article storage facility described above is provided next.

An article storage facility comprises: a first rail extending along a rail extending direction; a first storage rack extending along the first rail and configured to store a plurality of articles; a first transport device configured to move along the first rail and to transfer an article to and from the first storage rack; a second rail extending along the rail extending direction; and a second storage rack extending along the second rail and configured to store a plurality of articles; a second transport device configured to move along the second rail and to transfer an article to and from the second storage rack; wherein the first rail and the second rail are located to be spaced apart, by a set distance, from each other along the rail extending direction, a third rail extending along the rail extending direction between the first rail and the second rail, and having a length less than the set distance, wherein the third rail includes a fixed base whose location is fixed with respect to the first rail and the second rail and a movable rail portion capable of being fixed to the fixed base, and wherein the movable rail portion is so configured that a location of the movable rail portion with respect to the fixed base when fixed to the fixed base can be changed.

With the arrangement described above, the third rail is located between the first rail and second rail which are located to be spaced apart, by the set distance, from each other along the rail extending direction. This third rail includes a fixed base whose location is fixed with respect to the first rail and the second rail and a movable rail portion whose location with respect to the fixed base when fixed thereto can be changed. Because the length of the third rail along the rail extending direction is less than the set distance, a gap is formed between the movable rail portion and the first rail or the second rail. Therefore, vibrations are less easily transmitted from one of the first rail and the second rail to the other of the first rail and the second rail, through the third rail. In other words, vibrations caused by one of the transport devices are less easily transmitted to the other of the transport devices.

In addition, with the arrangement described above, it becomes easy to move the first transport device properly onto the third rail by adjusting the location of the movable rail with respect to the fixed base to the first rail side. It becomes easy to move the second transport device properly onto the third rail by adjusting the location of the movable rail with respect to the fixed base to the second rail side. Thus, it becomes easy to move either of the first transport device and the second transport device properly onto the third rail by changing the location of the movable rail portion with respect to the fixed base, depending on which transport device needs to be worked on for maintenance and/or repair.

Here, the movable rail portion of the third rail preferably has a movable base and a separate rail portion configured to be removably attachable to the movable base, wherein each of the first transport device and the second transport device preferably includes a guided portion configured to be guided by the first rail, the second rail, and the third rail, and wherein the separate rail portion is preferably so located to correspond in position, along the rail extending direction, to the guided portion of the first transport device when the first transport device is located on the third rail or to the guided portion of the second transport device when the second transport device is located on the third rail.

With the arrangement described above, the guided portion is located on the separate rail portion when the first transport device or the second transport device is located on the third rail. Therefore, maintenance, repair, and/or replacement, etc., of the guided portion can be performed by removing the guided portion from the first transport device or the second transport device, and by removing the separate rail portion from the movable base when the first transport device or the second transport device is located on the third rail.

In addition, in an arrangement in which the movable rail portion of the third rail preferably has a movable base and a separate rail portion configured to be removably attachable to the movable base, the guided portion of each of the first transport device and the guided portion of the second transport device preferably includes a first guided member and a second guided member spaced apart from each other along the rail extending direction, wherein the separate rail portion preferably includes a first separate rail member and a second separate rail member which are spaced apart from each other along the rail extending direction and which are provided at locations that correspond to locations of the first guided member and the second guided member respectively along the rail extending direction, and wherein the movable rail portion preferably has the first separate rail member, the second separate rail member, and a fixed rail member which is located between the first separate rail member and the second separate rail member and which is fixed to the movable base.

With the arrangement described above, when the first transport device or the second transport device is located on the third rail, the first guided member is located on the first separate rail member and the second guided member is located on the second separate rail member. Therefore, maintenance, repair, and/or replacement, etc., of the first guided member can be performed by removing the first guided member from the first transport device or the second transport device, and by removing the first separate rail member from the movable base when the first transport device or the second transport device is located on the third rail. In addition, maintenance, repair, and/or replacement, etc., of the second guided member can be performed by removing the second guided member from the first transport device or the second transport device, and by removing the second separate rail member from the movable base when the first transport device or the second transport device is located on the third rail.

In addition, the article storage facility preferably further comprises a stop member configured to stop the first transport device or the second transport device on the third rail, wherein the stop member is preferably configured to be removably provided at a location at which the stop member comes into contact with the first transport device moving on the third rail or the second transport device moving on the third rail.

With the arrangement described above, the stop member can be selectively and removably installed at a location for stopping the first transport device on the third rail, or at a location for stopping the second transport device on the third rail. Therefore, the first transport device or the second transport device can be stopped at a proper position on the third rail depending on the position at which the stop member is installed.

In addition, the third rail preferably has a connecting rail portion configured to connect the movable rail portion to the first rail or the second rail, wherein the connecting rail portion preferably includes a first connecting rail member fixed to the fixed base at a location on a first rail side with respect to the movable rail portion, and a second connecting rail member fixed to the fixed base at a location on a second rail side with respect to the movable rail portion.

With the arrangement described above, the first connecting rail member is located between the first rail and the movable rail portion whereas the second connecting rail member is located between the second rail and the movable rail portion. Since the first connecting rail member and the second connecting rail member are fixed to the fixed base whose location with respect to the first rail and the second rail is fixed. Thus, the location of the movable rail with respect to the fixed base when fixing it to the fixed base can be adjusted to be in alignment with the first rail using the first connecting rail member as a reference. Or the location of the movable rail with respect to the fixed base when fixing it to the fixed base can be adjusted to be in alignment with the second rail using the second connecting rail member as a reference. Therefore, it becomes easy to properly connect the first rail or the second rail to the movable rail portion.

In addition, in the arrangement in which the third rail has a connecting rail portion configured to connect the movable rail portion to the first rail or the second rail, the article storage facility preferably further comprises: a first adjustment mechanism attached to the first connecting rail member and configured to change a position of the movable rail portion with respect to the first connecting rail member, and a second adjustment mechanism attached to the second connecting rail member and configured to change a position of the movable rail portion with respect to the second connecting rail member.

With the arrangement described above, the location of the movable rail portion with respect to the first connecting rail member can be changed by operating the first adjustment mechanism attached to the first connecting rail member whereas the location of the movable rail portion with respect to the second connecting rail member can be changed by operating the second adjustment mechanism attached to the second connecting rail member. Therefore, adjustment of the location of the movable rail portion with respect to the first connecting rail member and thus to the first rail as well as adjustment of the location of the movable rail portion with respect to the second connecting rail member and thus to the second rail can be performed with relative ease.

INDUSTRIAL APPLICABILITY

The technology disclosed herein may be used in an article storage facility comprising: a first rail extending along a rail extending direction; a first storage rack extending along the first rail and configured to store a plurality of articles; a first transport device configured to move along the first rail and to transfer an article to and from the first storage rack; a second rail extending along the rail extending direction as in the case of the first rail; a second storage rack extending along the second rail and configured to store a plurality of articles; and a second transport device configured to move along the second rail and to transfer an article to and from the second storage rack.

What is claimed is:

1. An article storage facility comprising:
a first rail extending along a rail extending direction;
a first storage rack extending along the first rail and configured to store a plurality of articles;
a first transport device configured to move along the first rail and to transfer an article to and from the first storage rack;
a second rail extending along the rail extending direction;
a second storage rack extending along the second rail and configured to store a plurality of articles; and
a second transport device configured to move along the second rail and to transfer an article to and from the second storage rack;
wherein the first rail and the second rail are spaced apart by a set distance from each other along the rail extending direction,
a third rail extending along the rail extending direction between the first rail and the second rail, and having a length less than the set distance,
wherein the third rail includes a fixed base whose location is fixed with respect to the first rail and the second rail and a movable rail portion capable of being fixed to the fixed base, and
wherein the movable rail portion is configured such that a location of the movable rail portion with respect to the fixed base when fixed to the fixed base can be changed.

2. The article storage facility as defined in claim 1, wherein the movable rail portion of the third rail has a movable base and a separate rail portion configured to be removably attachable to the movable base,
wherein each of the first transport device and the second transport device includes a guided portion configured to be guided by the first rail, the second rail, and the third rail, and
wherein the separate rail portion is so located to correspond in position, along the rail extending direction, to the guided portion of the first transport device when the first transport device is located on the third rail or to the guided portion of the second transport device when the second transport device is located on the third rail.

3. The article storage facility as defined in claim 2, wherein the guided portion of each of the first transport device and the guided portion of the second transport device includes a first guided member and a second guided member spaced apart from each other along the rail extending direction,
wherein the separate rail portion includes a first separate rail member and a second separate rail member which are spaced apart from each other along the rail extending direction and which are provided at locations that correspond to locations of the first guided member and the second guided member, respectively, along the rail extending direction, and
wherein the movable rail portion has the first separate rail member, the second separate rail member, and a fixed rail member which is located between the first separate rail member and the second separate rail member and which is fixed to the movable base.

4. The article storage facility as defined in claim 1, further comprising:
a stop member configured to stop the first transport device or the second transport device on the third rail; and
wherein the stop member is configured to be removably provided at a location at which the stop member comes into contact with the first transport device moving on the third rail or the second transport device moving on the third rail.

5. The article storage facility as defined in claim 2, further comprising:
a stop member configured to stop the first transport device or the second transport device on the third rail; and
wherein the stop member is configured to be removably provided at a location at which the stop member comes into contact with the first transport device moving on the third rail or the second transport device moving on the third rail.

6. The article storage facility as defined in claim 3, further comprising:
a stop member configured to stop the first transport device or the second transport device on the third rail; and
wherein the stop member is configured to be removably provided at a location at which the stop member comes into contact with the first transport device moving on the third rail or the second transport device moving on the third rail.

7. The article storage facility as defined in claim 1, wherein the third rail has a connecting rail portion configured to connect the movable rail portion to the first rail or the second rail; and
wherein the connecting rail portion includes a first connecting rail member fixed to the fixed base at a location on a first rail side with respect to the movable rail portion, and a second connecting rail member fixed to the fixed base at a location on a second rail side with respect to the movable rail portion.

8. The article storage facility as defined in claim 7, further comprising:
- a first adjustment mechanism attached to the first connecting rail member and configured to change a position of the movable rail portion with respect to the first connecting rail member; and
- a second adjustment mechanism attached to the second connecting rail member and configured to change a position of the movable rail portion with respect to the second connecting rail member.

* * * * *